(12) United States Patent
Orita et al.

(10) Patent No.: US 11,456,378 B2
(45) Date of Patent: Sep. 27, 2022

(54) SEMICONDUCTOR DEVICE HAVING SUPER JUNCTION STRUCTURE WITH VARYING WIDTH

(71) Applicant: LAPIS Semiconductor Co., Ltd., Yokohama (JP)

(72) Inventors: Toshiyuki Orita, Miyazaki (JP); Tomomi Yamanobe, Miyazaki (JP); Makoto Higashihira, Miyazaki (JP); Yuuki Doi, Miyazaki (JP); Toshifumi Kobe, Miyazaki (JP); Masao Tsujimoto, Miyazaki (JP); Takao Kaji, Miyazaki (JP); Kiyofumi Kondou, Miyazaki (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 517 days.

(21) Appl. No.: 16/226,472

(22) Filed: Dec. 19, 2018

(65) Prior Publication Data
US 2019/0189800 A1    Jun. 20, 2019

(30) Foreign Application Priority Data
Dec. 19, 2017 (JP) .............................. JP2017-242892

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0634* (2013.01); *H01L 29/0692* (2013.01);
(Continued)

(58) Field of Classification Search
CPC ............. H01L 29/0623; H01L 29/0634; H01L 29/0684; H01L 29/0692; H01L 29/7802; H01L 29/0611; H01L 29/7813
See application file for complete search history.

(56) References Cited

U.S. PATENT DOCUMENTS

| 2007/0177444 A1* | 8/2007 | Miyajima | H01L 29/66712 365/221 |
| 2014/0151785 A1* | 6/2014 | Akagi | H01L 29/404 257/329 |
| 2019/0157399 A1* | 5/2019 | Kosugi | H01L 29/1608 |

FOREIGN PATENT DOCUMENTS

| JP | 2005203565 | 7/2005 |
| JP | 2007235095 | 9/2007 |

(Continued)

OTHER PUBLICATIONS

"Office Action of Japan Counterpart Application", dated Oct. 12, 2021, with English translation thereof, p. 1-p. 8.

*Primary Examiner* — Matthew G Landau
*Assistant Examiner* — Mark Hatzilambrou
(74) *Attorney, Agent, or Firm* — JCIPRNET

(57) ABSTRACT

The disclosure reduces the risk of collapse of the wall surrounding the trench and suppresses the withstand voltage fluctuation that accompanies the manufacturing variation for a semiconductor device having a super junction structure. The semiconductor device includes a drift layer of a first conductivity type and a plurality of embedded parts embedded in the drift layer. The embedded parts are of a second conductivity type different from the first conductivity type, and the embedded parts are arranged with a first direction as a longitudinal direction and spaced from each other along a second direction that intersects the first direction. A width of each of the embedded parts in the second direction changes continuously along the first direction.

5 Claims, 12 Drawing Sheets

(51) Int. Cl.
*H01L 29/08* (2006.01)
*H01L 29/423* (2006.01)
*H01L 29/10* (2006.01)
*H01L 29/66* (2006.01)
*H01L 29/417* (2006.01)

(52) U.S. Cl.
CPC ...... *H01L 29/0878* (2013.01); *H01L 29/1033* (2013.01); *H01L 29/41766* (2013.01); *H01L 29/4238* (2013.01); *H01L 29/66712* (2013.01); *H01L 29/66734* (2013.01); *H01L 29/7802* (2013.01); *H01L 29/7827* (2013.01)

(56) References Cited

FOREIGN PATENT DOCUMENTS

| | | |
|---|---|---|
| JP | 2009147234 | 7/2009 |
| JP | 2010177373 | 8/2010 |
| JP | 2011243696 | 12/2011 |
| JP | 2017054959 | 3/2017 |

\* cited by examiner

SEMICONDUCTOR DEVICE HAVING SUPER JUNCTION STRUCTURE WITH VARYING WIDTH

CROSS-REFERENCE TO RELATED APPLICATION

This application claims the priority benefit of Japanese Application Serial No. 2017-242892, filed on Dec. 19, 2017. The entirety of each of the above-mentioned patent applications is hereby incorporated by reference herein and made a part of this specification.

BACKGROUND

Technical Field

The disclosure relates to a semiconductor device and a manufacturing method of the semiconductor device.

Description of Related Art

In the high withstand voltage power MOSFET (Metal-Oxide-Semiconductor Field-Effect Transistor), the drift layer is set to low concentration and the depletion layer is extended to hold the voltage in order to secure the withstand voltage. Therefore, as the withstand voltage of the element increases, the drift layer becomes thicker and the on-resistance becomes higher. A super junction structure is known as a structure for improving the trade-off relationship between the withstand voltage and the on-resistance. The super junction structure is a structure formed by alternately arranging P-type regions (P-type columns) and N-type regions (N-type columns) in the drift layer of a vertical power MOSFET.

In the conventional power MOSFET, the depletion layer is stretched in the longitudinal direction in the drift layer during reverse bias, whereas in the super junction structure, the depletion layer stretches in the transverse direction from the PN junction formed by periodically arranged P-type columns and N-type columns. As a result, depletion is facilitated even if the concentration of the drift layer, i.e., the current path, is increased. Thus, it is possible to achieve both high withstand voltage and low on-resistance.

For example, Patent Document 1 describes a semiconductor device, which has a drift layer of a first conductivity type formed on the main front surface side of the semiconductor substrate and having a plurality of trenches formed in a stripe shape with a direction as the longitudinal direction, and second conductivity type regions embedded in the trenches. The super junction structure of the semiconductor device is formed by alternately and repetitively arranging the first conductivity type regions, which are formed by the remaining portions between the trenches in the drift layer, and the second conductivity type regions. In this semiconductor device, the trenches are divided into a plurality of parts in the longitudinal direction, and the plurality of parts are shifted in the direction vertical to the longitudinal direction of the trenches.

On the other hand, Patent Document 2 describes a semiconductor device having a super junction structure that has a first column layer in which the balance of the impurity amount swings to be rich in N-type impurity, and a second column layer in which the balance of the impurity amount swings to be rich in P-type impurity, which expresses the concept that the surplus amount of the impurity amount caused by variations in shape processing and impurity concentration can be canceled by breaking in advance the balance of the impurity amount in the depth direction.

RELATED ART

Patent Document

[Patent Document 1] Japanese Laid-open No. 2011-243696
[Patent Document 2] Japanese Laid-open No. 2009-147234

SUMMARY

Problem to be Solved

A power MOSFET having a super junction structure is, for example, formed as follows. That is, in the cell part of the power MOSFET, stripe-shaped trenches are formed regularly in the N-type epitaxial layer, and P-type semiconductors are embedded in the trenches, so as to form the super junction structure. The trench is formed in a shape that extends straight from one end of the cell part to the other end opposite to the one end, and the length in the longitudinal direction from one end to the other end of the cell part is extremely long compared to the length in the width direction. For this reason, the wall surrounding the trench may collapse.

In addition, for the super junction structure, in order to expand the depletion layer in the N-type column to obtain the maximum withstand voltage, it is necessary to equalize the impurity amount of the P-type column and the impurity amount of the N-type region. Here, the impurity amount in the P-type column corresponds to the product of the impurity concentration of the P-type column and the volume of the P-type column, and the impurity amount in the N-type column corresponds to the product of the impurity concentration of the N-type column and the volume of the N-type column. However, in the actual manufacturing process, the volume and impurity concentration of the P-type column and the N-type column may deviate from the target values due to manufacturing variation. As a result, the impurity amount of the P-type column and the impurity amount of the N-type column may not be equal to each other, resulting that the desired withstand voltage cannot be obtained sometimes. Moreover, the withstand voltage fluctuation that accompanies the manufacturing variation may become extremely large.

According to the technique described in Patent Document 1, since the trenches are divided into a plurality of parts in the longitudinal direction and the plurality of parts are shifted in the direction vertical to the longitudinal direction of the trenches, the risk of collapse of the wall surrounding the outer periphery of the trench is reduced and the collapse of the charge balance between the P-type column and the N-type column is suppressed. However, according to the structure in which the trenches are shifted in the vertical direction, the gate electrode disposed on the N-type region is divided, so the channel region decreases and the on-resistance rises. Furthermore, in the actual manufacturing process, there may be variations in the impurity concentration and dimensions of the N-type column and the P-type column, and therefore the desired withstand voltage cannot be obtained sometimes. Moreover, the withstand voltage fluctuation that accompanies the manufacturing variation may become large.

On the other hand, by differentiating the widths of the N-type column and the P-type column according to the depth to unbalance the impurity amount of the P-type column and the impurity amount of the N-type column, like the technique described in Patent Document 2, it can be expected to achieve the effect of suppressing the withstand voltage fluctuation that accompanies the manufacturing variation. However, to form the N-type column and the P-type column having different widths according to the depth, it is necessary to add photolithography and etching processes, and the manufacturing costs of the semiconductor device will increase.

The disclosure reduces the risk of collapse of the wall surrounding the trench and suppress the withstand voltage fluctuation that accompanies the manufacturing variation for a semiconductor device having a super junction structure.

Means for Solving the Problem

A semiconductor device according to the disclosure includes a drift layer of a first conductivity type; and a plurality of embedded parts embedded in the drift layer and being of a second conductivity type different from the first conductivity type, wherein the embedded parts are arranged with a first direction as a longitudinal direction and spaced from each other along a second direction that intersects the first direction, wherein a width of each of the embedded parts in the second direction changes continuously along the first direction.

Another semiconductor device according to the disclosure includes a drift layer of a first conductivity type; and a plurality of embedded parts embedded in the drift layer and being of a second conductivity type different from the first conductivity type, wherein the embedded parts are arranged with a first direction as a longitudinal direction and spaced from each other in a second direction that intersects the first direction, wherein each of the embedded parts includes portions that have different widths in the second direction.

Another semiconductor device according to the disclosure includes a drift layer of a first conductivity type; and a plurality of embedded parts embedded in the drift layer and being of a second conductivity type different from the first conductivity type, wherein the embedded parts are arranged with a first direction as a longitudinal direction and spaced from each other in a second direction that intersects the first direction, wherein a width of each of the embedded parts in the second direction is the same according to each part along the first direction, and the width of any one of the embedded parts in the second direction is different from the width of any other one of the embedded parts in the second direction.

A manufacturing method of a semiconductor device according to the disclosure includes preparing a semiconductor substrate having a drift layer of a first conductivity type; forming a plurality of trenches in the drift layer, wherein the trenches are arranged with a first direction as a longitudinal direction and spaced from each other along a second direction that intersects the first direction; and embedding a semiconductor of a second conductivity type different from the first conductivity type in each of the trenches, wherein a width of each of the trenches in the second direction changes continuously along the first direction.

Another manufacturing method of a semiconductor device according to the disclosure includes preparing a semiconductor substrate having a drift layer of a first conductivity type; forming a plurality of trenches in the drift layer, wherein the trenches are arranged with a first direction as a longitudinal direction and spaced from each other along a second direction that intersects the first direction; and embedding a semiconductor of a second conductivity type different from the first conductivity type in each of the trenches, wherein each of the trenches includes portions that have different widths in the second direction.

Another manufacturing method of a semiconductor device according to the disclosure includes preparing a semiconductor substrate having a drift layer of a first conductivity type; forming a plurality of trenches in the drift layer, wherein the trenches are arranged with a first direction as a longitudinal direction and spaced from each other along a second direction that intersects the first direction; and embedding a semiconductor of a second conductivity type different from the first conductivity type in each of the trenches, wherein a width of each of the trenches in the second direction is the same according to each part along the first direction, and the width of any one of the trenches in the second direction is different from the width of any other one of the trenches in the second direction.

Effects

According to the disclosure, it is possible to reduce the risk of collapse of the wall surrounding the trench and suppress the withstand voltage fluctuation that accompanies the manufacturing variation for a semiconductor device having a super junction structure.

DESCRIPTION OF THE EMBODIMENTS

Figure 1:
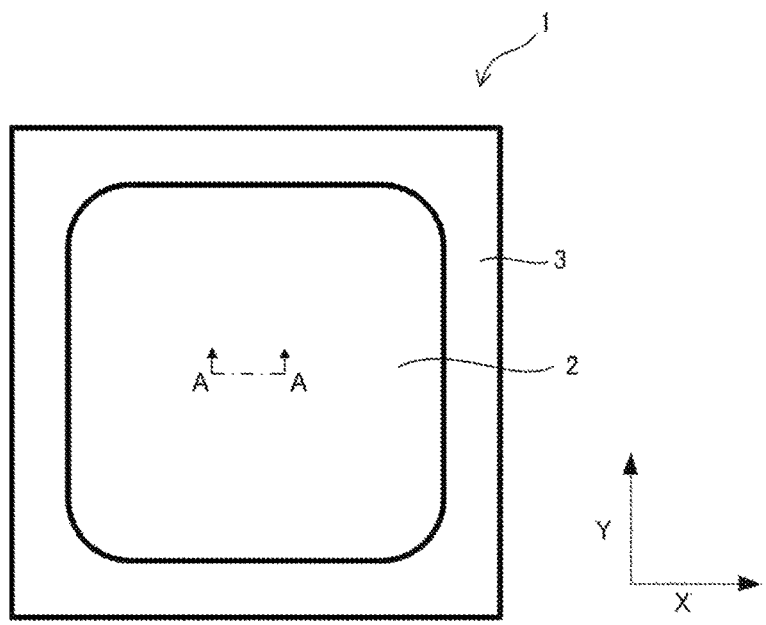
FIG. 1 is a plan view of the semiconductor device according to an embodiment of the disclosure.

Hereinafter, an exemplary embodiment of the disclosure will be described with reference to the drawings. In the drawings, the same or equivalent components and portions are denoted by the same reference numerals and descriptions thereof are not repeated.

First Embodiment

FIG. 1 is a plan view of a semiconductor device 1 according to an embodiment of the disclosure. The semiconductor device 1 constitutes a MOSFET, in which the gate structure is a planar gate type and the structure of the drift layer is a super junction structure. The semiconductor device 1 has a square or rectangular outline in the plan view and includes a cell part 2 and a peripheral part 3 surrounding the cell part 2. Since the structure of the peripheral part 3 in the semiconductor device 1 is the same as that of a general MOSFET, a detailed description of the structure of the peripheral part 3 is omitted. The following mainly describes the configuration of the cell part 2. In the following description, two directions that are parallel to the main surface of the semiconductor device 1 and orthogonal to each other are defined as the X direction and the Y direction respectively, and the thickness direction of the semiconductor device 1 is defined as the Z direction.

Figure 2:
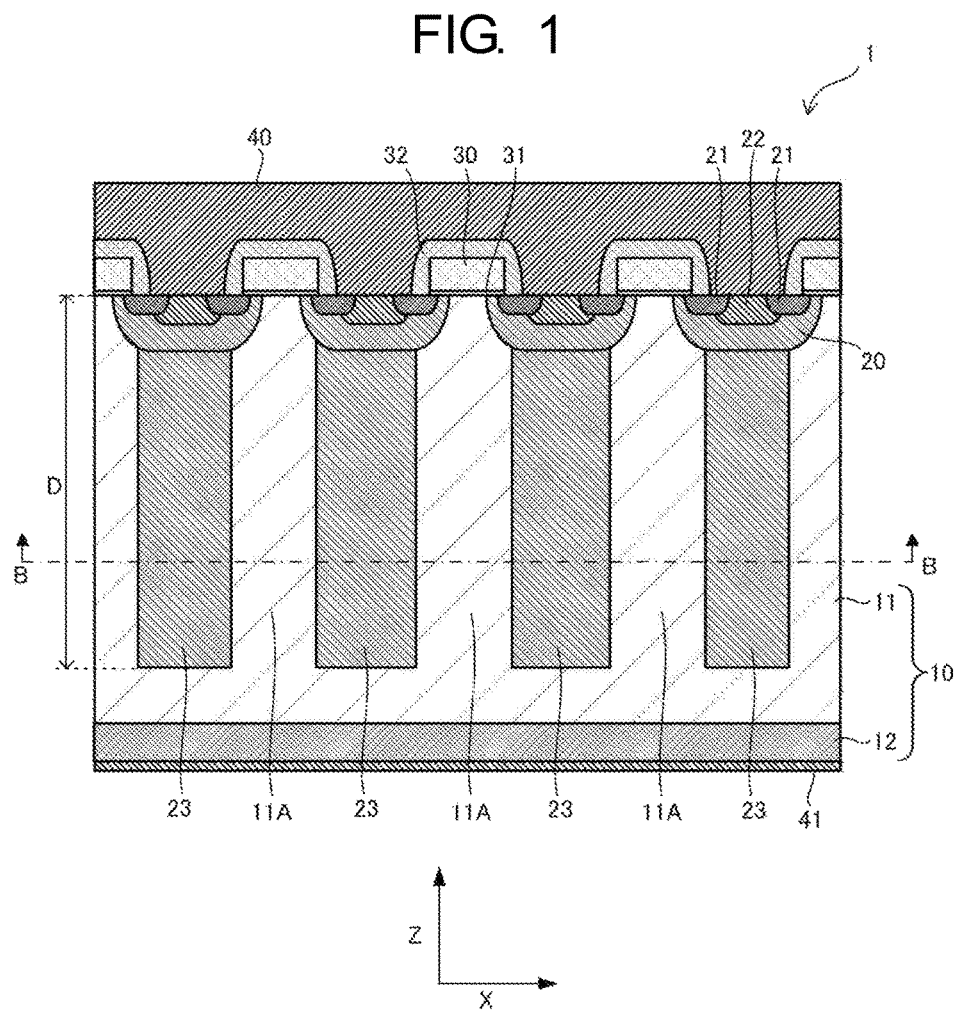
FIG. 2 is a cross-sectional view taken along the line A-A in FIG. 1.

FIG. 2 is a cross-sectional view taken along the line A-A in FIG. 1. That is, FIG. 2 shows an X-Z cross section of the cell part 2. As shown in FIG. 2, the semiconductor device 1 has a semiconductor substrate 10, which includes a drift layer 11 made of an N-type semiconductor, and a drain layer 12 connected to the bottom portion of the drift layer 11 and made of an N-type semiconductor having an impurity concentration higher than the impurity concentration of the drift layer 11.

A plurality of body parts 20 each made of a P-type semiconductor are disposed in the surface layer portion of the drift layer 11. The body parts 20 are arranged and spaced from each other in the X direction. A pair of sources 21 made of an N-type semiconductor and arranged apart from each other, and a body contact 22 made of a P-type semiconductor and arranged between the pair of sources 21 are disposed in the surface layer portion of each of the body parts 20. The impurity concentration of the body contact 22 is higher than the impurity concentration of the body part 20.

A gate electrode 30 is disposed via a gate insulating film 31 at a position across every two adjacent body parts 20 on the front surface of the drift layer 11 (semiconductor substrate 10). The gate electrode 30 is composed of polysilicon, for example. The upper surface and the side surface of the gate electrode 30 are covered by an insulating film 32.

A source electrode 40 composed of a conductor such as Al covers the front surface of the drift layer 11 (semiconductor substrate 10) to embed the gate electrode 30 therein and is connected to each of the sources 21 and each of the body contacts 22. A drain electrode 41 formed by stacking a plurality of conductor films covers the rear surface of the semiconductor substrate 10 and is connected to the drain layer 12.

A plurality of embedded parts 23 made of a P-type semiconductor and extending into the drift layer 11 in the Z direction are connected to the bottom portions of the body parts 20 respectively. The embedded parts 23 are arranged and spaced from each other in the X direction inside the drift layer 11. Each of the embedded parts 23 constitutes a P-type column, and each portion of the drift layer 11 extending between the adjacent embedded parts 23 constitutes an N-type column 11A. That is, a super junction structure, in which the P-type columns and the N-type columns 11A are arranged alternately along the X direction, is constructed inside the drift layer 11.

Figure 3:
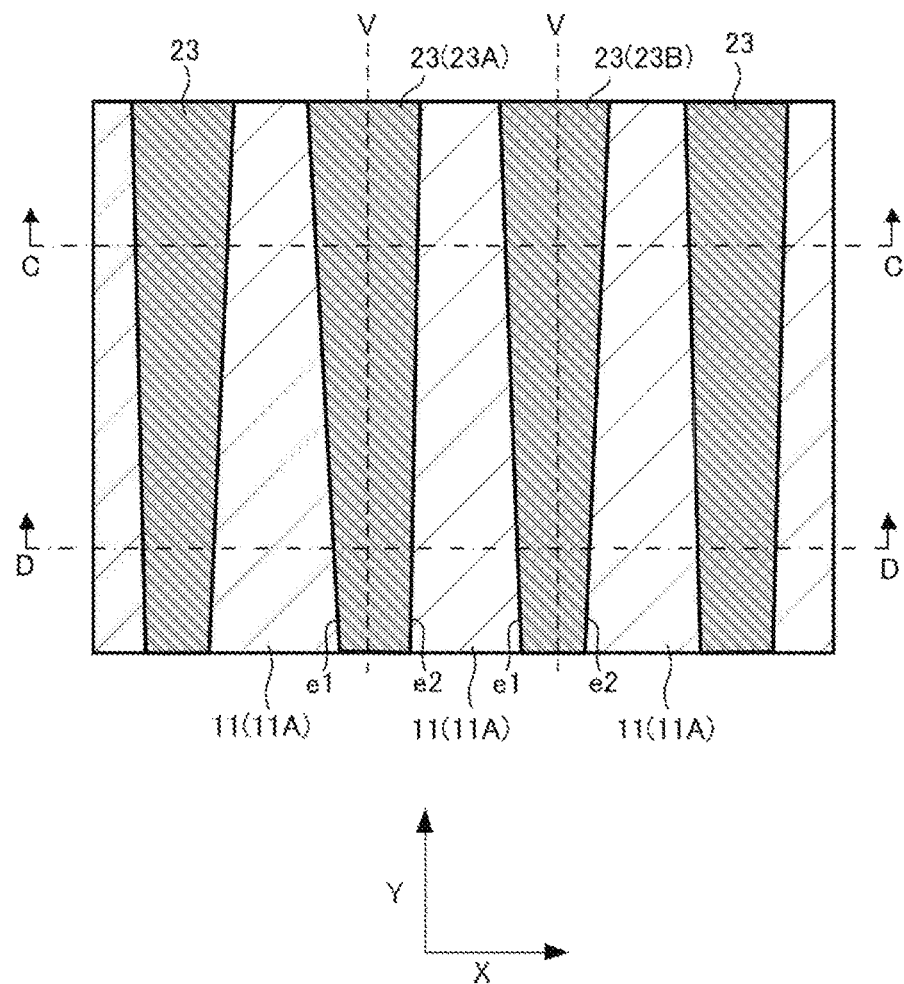
FIG. 3 is a cross-sectional view taken along the line B-B in FIG. 2 and showing a pattern of the embedded parts in the X-Y cross-sectional view according to an embodiment of the disclosure.

FIG. 3 is a cross-sectional view taken along the line B-B in FIG. 2 and showing a pattern of the embedded parts 23 in the X-Y cross-sectional view. As shown in FIG. 3, the embedded part 23 has an elongated outline with the Y direction as the longitudinal direction when viewed in the X-Y cross section. The embedded parts 23 are arranged and spaced from each other along the X direction that is orthogonal to the longitudinal direction. In addition, two outer edges e1 and e2, which are opposite to each other across an imaginary line V parallel to the longitudinal direction (Y direction), of each embedded part 23 as viewed in the X-Y cross section are straight and inclined with respect to the imaginary line V. That is, the width (dimension in the X direction) of each embedded part 23 changes continuously from one side of the cell part 2 to the other side opposite to the one side along the longitudinal direction (Y direction). The portion of the drift layer 11 extending between the adjacent embedded parts 23 (that is, the portion constituting the N-type column 11A) has the same configuration as the embedded part 23.

Figure 4:
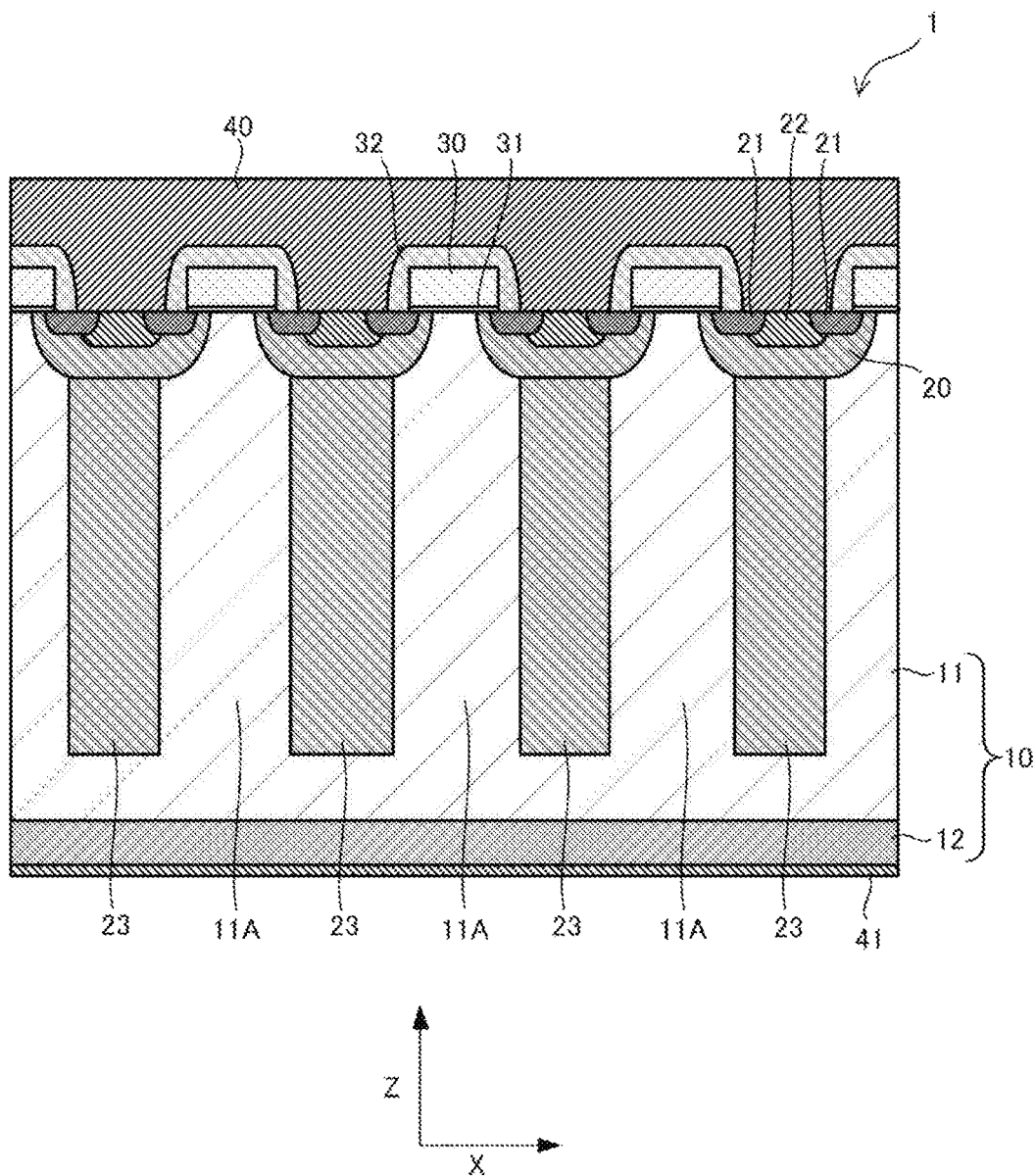
FIG. 4 is a cross-sectional view of the semiconductor device when it is cut along the line D-D in FIG. 3.

Here, FIG. 4 is a cross-sectional view of the semiconductor device 1 when it is cut along the line D-D in FIG. 3. That is, FIG. 4 shows a cross section (X-Z cross section) parallel to the cross section shown in FIG. 2. FIG. 2 corresponds to a cross-sectional view when the semiconductor device 1 is cut along the line C-C in FIG. 3. Through comparison between FIG. 2 and FIG. 4, it is clear that the width of each embedded part 23 differs according to the position of each embedded part 23 in the longitudinal direction (Y direction).

Among the two outer edges e1 and e2, which are opposite to each other across the imaginary line V (see FIG. 3), of each embedded part 23, the inclination angle of one outer edge e1 with respect to the imaginary line V may be different from the inclination angle of the other outer edge e2 with respect to the imaginary line V. Further, the inclination angle of at least one of the outer edges e1 and e2 of any embedded part 23A of the embedded parts 23 with respect to the imaginary line V may be different from any inclination angle of each of the outer edges e1 and e2 of any other embedded part 23B of the embedded parts 23 with respect to the imaginary line V.

The width of each embedded part 23 may change in a range of 0.01 μm to 10 μm, for example, along the longitudinal direction (Y direction). In addition, the length D (see FIG. 2) from the front surface of the semiconductor substrate 10 to the tip of each embedded part 23 is about 50 μm, for example. Moreover, the impurity concentration of each embedded part 23 is about $5\times10^{15}$ cm$^{-3}$, for example, and the impurity concentration of the drift layer 11 is about $5\times10^{15}$ cm$^{-3}$, for example.

A manufacturing method of the semiconductor device 1 will be described below. FIG. 5A to FIG. 5E are cross-sectional views (X-Z cross-sectional views) showing an example of the manufacturing method of the semiconductor device 1.

Figure 5A:
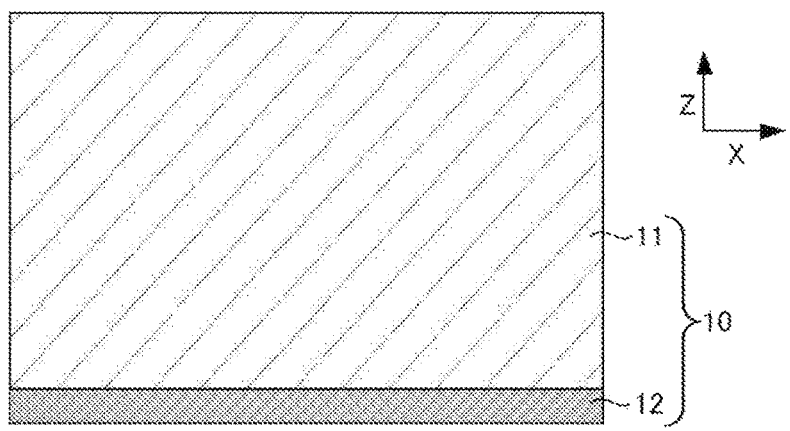
FIG. 5A is a cross-sectional view showing an example of the manufacturing method of the semiconductor device according to an embodiment of the disclosure.

First, a semiconductor substrate 10, formed by stacking an N-type semiconductor layer that functions as the drain layer 12 and an N-type semiconductor layer that functions as the drift layer 11, is prepared (FIG. 5A).

Figure 5B:
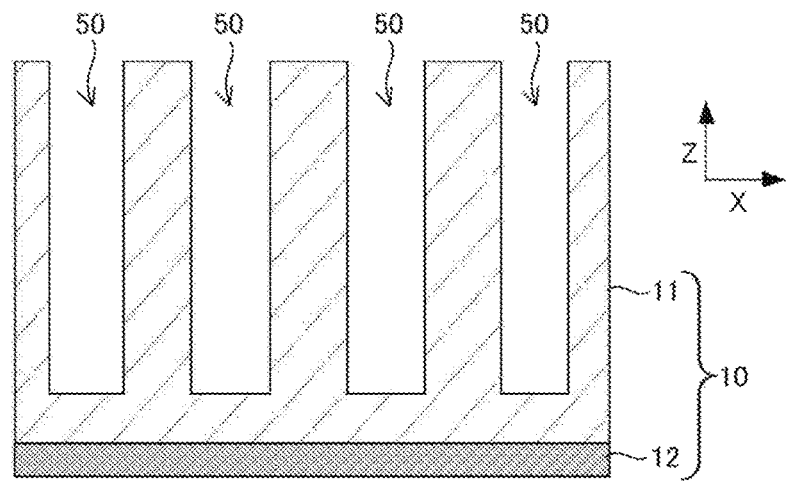
FIG. 5B is a cross-sectional view showing an example of the manufacturing method of the semiconductor device according to an embodiment of the disclosure.

Next, the drift layer 11 is partially etched by using photolithography and etching techniques, so as to form a trench 50 of the drift layer 11 at each predetermined formation position of the embedded part 23 (FIG. 5B). Each trench 50 is formed in a shape corresponding to the shape of the embedded part 23. That is, a plurality of trenches 50 are formed in the drift layer 11 with the Y direction as the longitudinal direction and are spaced from each other along the X direction. Also, each trench 50 is formed so that the width of each trench 50 (dimension in the X direction) changes continuously from one side of the cell part 2 to the other side opposite to the one side along the longitudinal direction (Y direction).

Figure 5C:
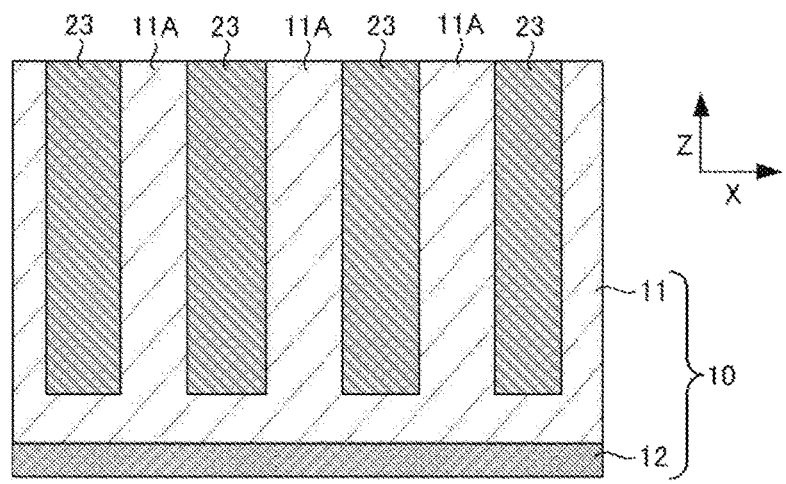
FIG. 5C is a cross-sectional view showing an example of the manufacturing method of the semiconductor device according to an embodiment of the disclosure.

Next, a P-type semiconductor is formed on the front surface of the drift layer 11 by using an epitaxial growth method, and the P-type semiconductor is embedded in each trench 50 to form the embedded part 23. Thereafter, the surplus P-type semiconductor formed on the front surface of the drift layer 11 is removed by using a CMP (Chemical Mechanical Polishing) technique (FIG. 5C). Each of the embedded parts 23 constitutes a P-type column, and each portion of the drift layer 11 extending between the adjacent embedded parts 23 constitutes an N-type column 11A. A super junction structure, in which the P-type columns and the N-type columns 11A are arranged alternately along the X direction, is formed inside the drift layer 11.

Figure 5D:
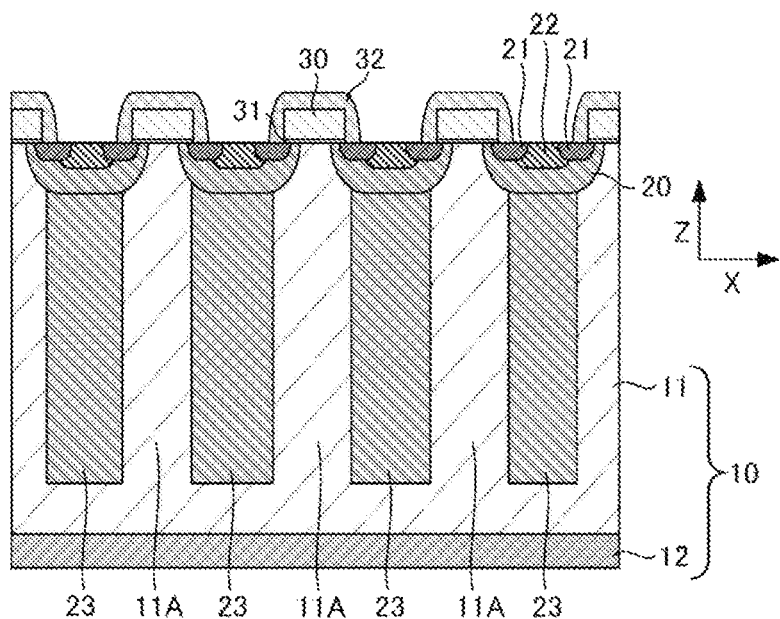
FIG. 5D is a cross-sectional view showing an example of the manufacturing method of the semiconductor device according to an embodiment of the disclosure.

Next, a gate insulating film 31 is formed on the front surface of the semiconductor substrate 10 by using a thermal oxidation method. Then, a polysilicon film is formed on the front surface of the gate insulating film 31 by CVD (Chemical Vapor Deposition), and the polysilicon film is patterned to form a gate electrode 30. Next, an insulating film 32 is formed to cover the upper surface and the side surface of the gate electrode 30. Thereafter, a body part 20, a body contact 22, and sources 21 are sequentially formed in the surface layer portion of the drift layer 11 by using an ion implantation technique. The body part 20 is disposed corresponding to each of the embedded parts 23 and is connected to the corresponding embedded part 23 (FIG. 5D).

Figure 5E:
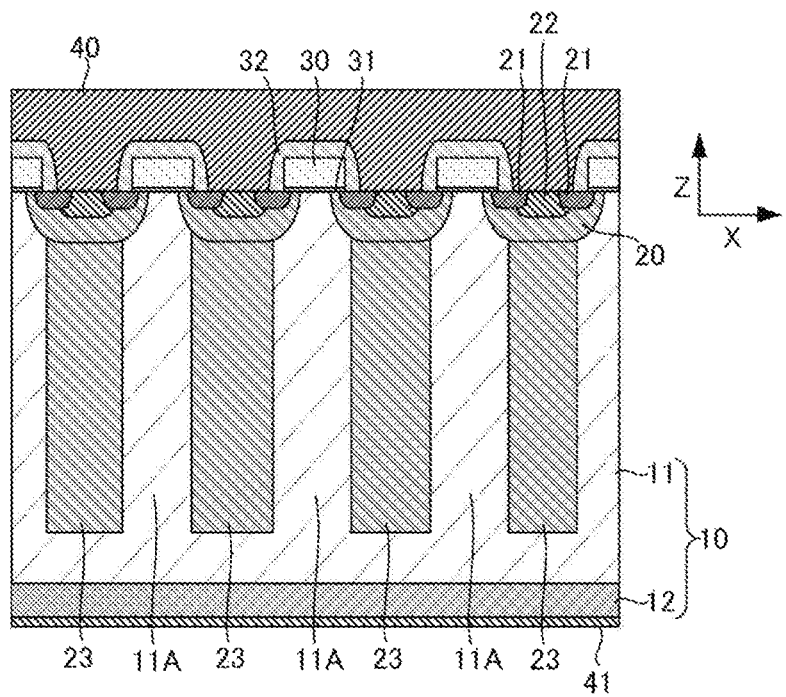
FIG. 5E is a cross-sectional view showing an example of the manufacturing method of the semiconductor device according to an embodiment of the disclosure.

Next, a source electrode 40 and a drain electrode 41 are formed by using a vapor deposition method or a sputtering method (FIG. 5E).

Figure 6:
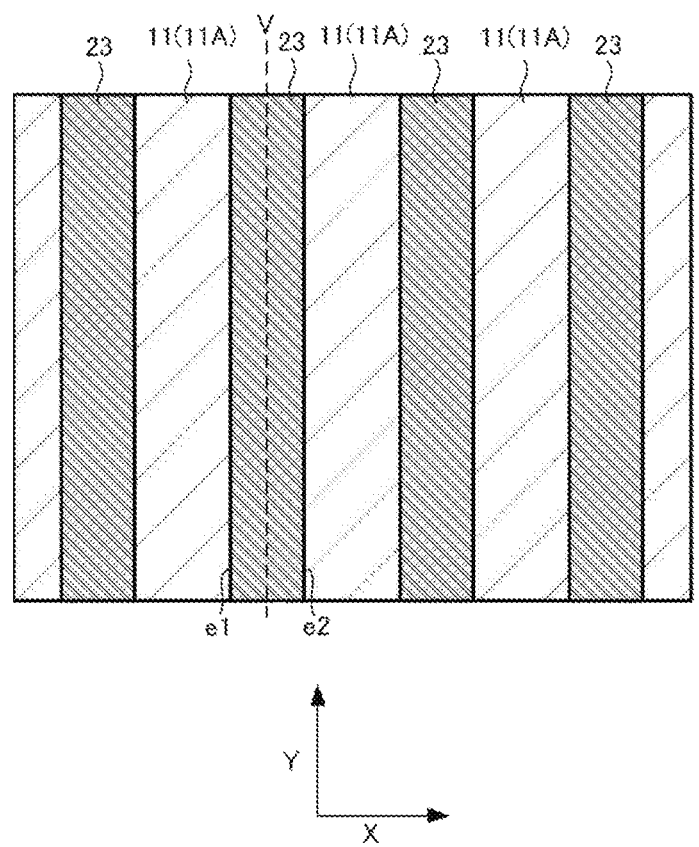
FIG. 6 is a view showing a pattern of the embedded parts in the X-Y cross-sectional view according to a comparative example.

FIG. 6 is a view showing a pattern of the embedded parts 23 in the X-Y cross-sectional view according to a comparative example. In the comparative example, the two outer edges e1 and e2, opposite to each other across the imaginary line V parallel to the longitudinal direction (Y direction) of the embedded part 23, are straight lines parallel to the imaginary line V. That is, the width (dimension in the X direction) of each embedded part 23 is the same at each part in the longitudinal direction (Y direction), and the embedded parts 23 have the same width.

In terms of the pattern of the embedded parts 23 according to the comparative example, the wall surrounding the trench formed at the predetermined formation position of the embedded part 23 may collapse. Furthermore, for the pattern of the embedded parts 23 according to the comparative example, the volumes and the impurity concentrations of the embedded part 23 constituting the P-type column and the drift layer 11 constituting the N-type column 11A may deviate from the target values due to manufacturing variation. As a result, the impurity amount of the P-type column and the impurity amount of the N-type column 11A may not be equal to each other, and the desired withstand voltage may not be obtained.

On the other hand, for the semiconductor device 1 according to the embodiment of the disclosure, the width of each embedded part 23 changes continuously along the longitudinal direction (Y direction). Thus, in the region where the width of the embedded part 23 is relatively small, the thickness of the wall surrounding the trench corresponding to the width of the N-type column 11A increases and the strength of the wall increases, so it is possible to reduce the risk of collapse of the wall surrounding the trench.

Furthermore, by continuously changing the width of each embedded part 23 along the longitudinal direction (Y direction), the impurity amount of the embedded part 23 constituting the P-type column and the impurity amount of the drift layer 11 constituting the N-type column 11A are unbalanced. Thus, the fluctuation in charge balance due to manufacturing variation is suppressed, and as a result, the withstand voltage fluctuation can be suppressed.

Further, by differentiating the inclination angles of the two outer edges e1 and e2, opposite to each other across the imaginary line V, of each embedded part 23 with respect to the imaginary line V, it is possible to facilitate the effect of suppressing withstand voltage fluctuation that accompanies the manufacturing variation. In addition, by differentiating the inclination angle of at least one of the outer edges e1 and e2 of any embedded part 23A of the embedded parts 23 with respect to the imaginary line V from any inclination angle of each of the outer edges e1 and e2 of the other embedded part 23B of the embedded parts 23 with respect to the imaginary line V, the effect of suppressing withstand voltage fluctuation that accompanies the manufacturing variation can be further facilitated.

In addition, in the semiconductor device 1 according to the embodiment of the disclosure, since the width of the embedded part 23 is constant in the depth direction (Z direction) of the semiconductor substrate 10, it is unnecessary to add photolithography and etching processes, and compared with the case where the width of the P-type column differs according to the depth, the manufacturing costs can be reduced.

Second Embodiment

Figure 7:
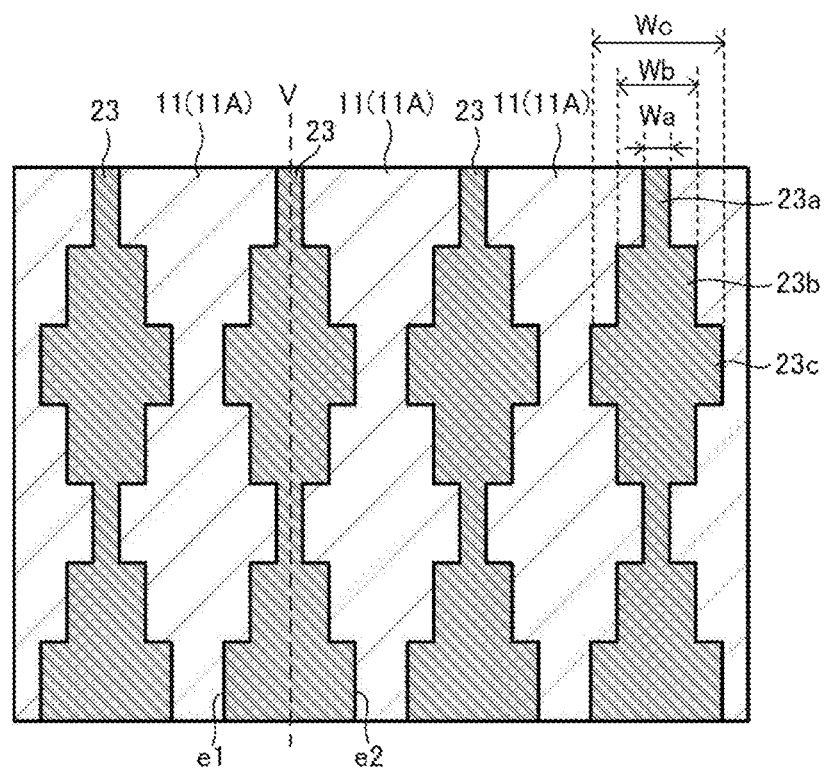
FIG. 7 is a view showing a pattern of the embedded parts in the X-Y cross-sectional view according to the second embodiment of the disclosure.
Figure 7:
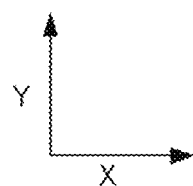

FIG. 7 is a view showing a pattern of the embedded parts 23 in the X-Y cross-sectional view according to the second embodiment of the disclosure. As in the first embodiment, each of the embedded parts 23 has an elongated shape with the Y direction as the longitudinal direction, and the embedded parts 23 are arranged and spaced from each other in the X direction. In the present embodiment, two outer edges e1 and e2, opposite to each other across the imaginary line V parallel to the longitudinal direction (Y direction), of each embedded part 23 are stepped respectively. That is, the width (dimension in the X direction) of each embedded part 23 differs according to the part along the longitudinal direction (Y direction) of the embedded part 23, and changes stepwise along the longitudinal direction (Y direction). Specifically, each embedded part 23 has a configuration in which a portion 23$a$ having a width Wa, a portion 23$b$ having a width Wb (>the width Wa), and a portion 23$c$ having a width We (>the width Wb) are continuous in the longitudinal direction (Y direction). The width Wa is about 2.7 μm, for example, the width Wb is about 3.0 μm, for example, and the width Wc is about 3.3 μm, for example.

The portion of the drift layer 11 extending between the adjacent embedded parts 23 (that is, the portion constituting the N-type column 11A) has the same configuration as the embedded part 23. The configuration, except for the pattern of the embedded parts 23, is the same as that of the semiconductor device 1 according to the first embodiment.

In terms of the pattern of the embedded parts 23 according to the second embodiment of the disclosure, as in the first embodiment, in the region where the width of the embedded part 23 is relatively small, the thickness of the wall surrounding the trench corresponding to the width of the N-type column 11A increases and the strength of the wall increases, so it is possible to reduce the risk of collapse of the wall surrounding the trench. Furthermore, by differentiating the width of each embedded part 23 according to the part along the longitudinal direction of the embedded part 23, the impurity amount of the embedded part 23 constituting the P-type column and the impurity amount of the drift layer 11 constituting the N-type column 11A are unbalanced. Thus, the fluctuation in charge balance due to manufacturing variation is suppressed, and as a result, the withstand voltage fluctuation can be suppressed.

In addition, since the width of the embedded part 23 is constant in the depth direction (Z direction) of the semiconductor substrate 10, it is unnecessary to add photolithography and etching processes, and compared with the case where the width of the P-type column differs according to the depth, the manufacturing costs can be reduced.

Third Embodiment

Figure 8:
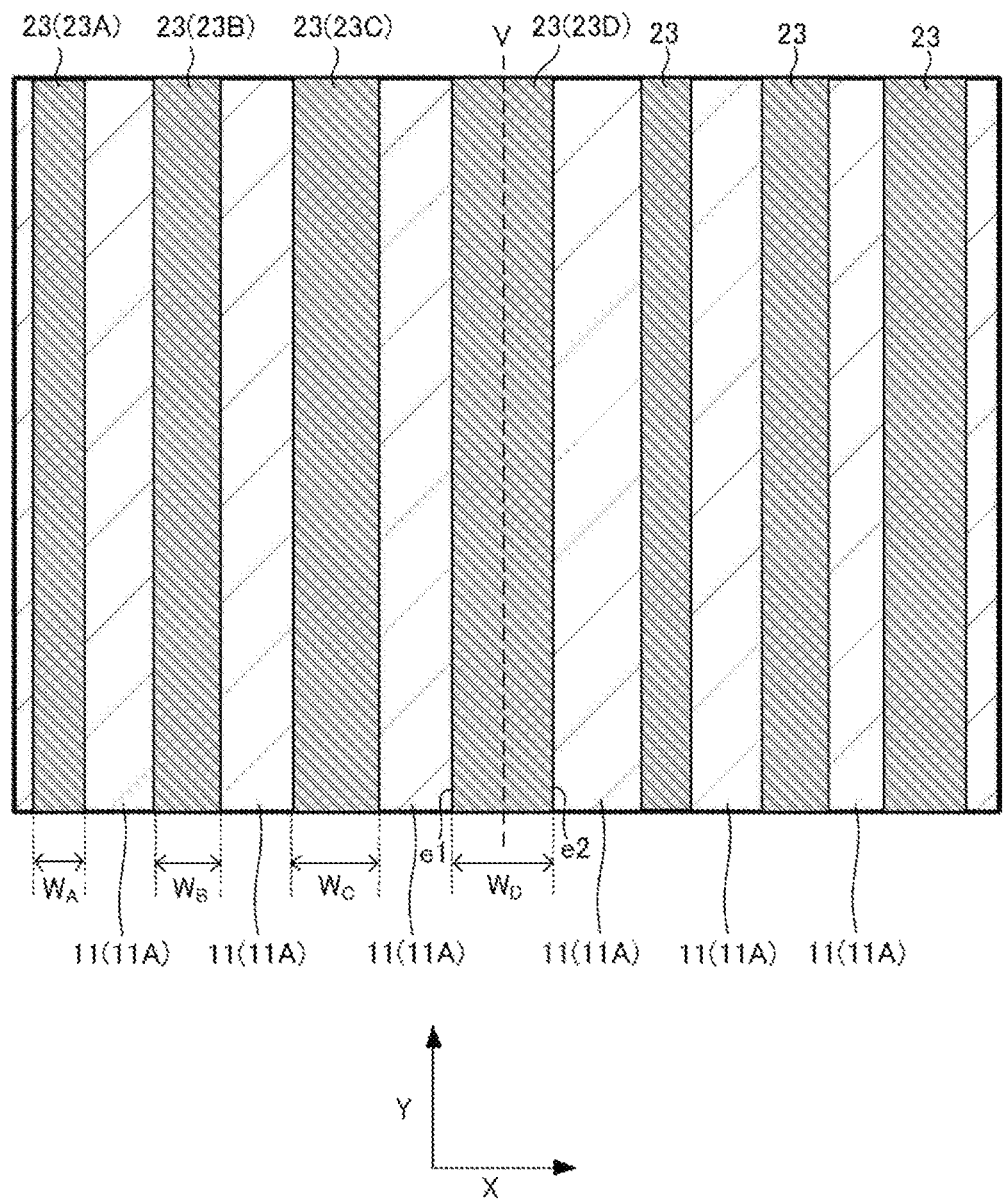
FIG. 8 is a view showing a pattern of the embedded parts in the X-Y cross-sectional view according to the third embodiment of the disclosure.

FIG. 8 is a view showing a pattern of the embedded parts 23 in the X-Y cross-sectional view according to the third embodiment of the disclosure. As in the first embodiment, each of the embedded parts 23 has an elongated shape with the Y direction as the longitudinal direction, and the embedded parts 23 are arranged and spaced from each other in the X direction. In the present embodiment, two outer edges e1 and e2, opposite to each other across the imaginary line V parallel to the longitudinal direction (Y direction), of each embedded part 23 are straight and parallel to the imaginary line V respectively. That is, the width (dimension in the X direction) of each embedded part 23 is the same at each part in the longitudinal direction (Y direction). However, the width of the embedded part 23 is different from that of the other embedded parts 23. That is, the width of any one of the embedded parts 23 is different from the width of any other one of the embedded parts 23. In the example shown in FIG. 8, the width WB of the embedded part 23B is larger than the width WA of the embedded part 23A, the width Wc of the embedded part 23C is larger than the width WB of the embedded part 23B, and the width WD of the embedded part 23D is larger than the width Wc of the embedded part 23C.

The portion of the drift layer 11 extending between the adjacent embedded parts 23 (that is, the portion constituting the N-type column 11A) has the same configuration as the embedded part 23. The configuration, except for the pattern of the embedded parts 23, is the same as that of the semiconductor device 1 according to the first embodiment.

In terms of the pattern of the embedded parts 23 according to the third embodiment of the disclosure, as in the first embodiment, in the region where the width of the embedded part 23 is relatively small, the thickness of the wall surrounding the trench corresponding to the width of the N-type column 11A increases and the strength of the wall increases, so it is possible to reduce the risk of collapse of the wall surrounding the trench. Furthermore, by differentiating the width of the embedded part 23 from those of the other embedded parts 23, the impurity amount of the embedded part 23 constituting the P-type column and the impurity amount of the drift layer 11 constituting the N-type column 11A are unbalanced. Thus, the fluctuation in charge balance due to manufacturing variation is suppressed, and as a result, the withstand voltage fluctuation can be suppressed.

In addition, since the width of the embedded part 23 is constant in the depth direction (Z direction) of the semiconductor substrate 10, it is unnecessary to add photolithography and etching processes, and compared with the case where the width of the P-type column differs according to the depth, the manufacturing costs can be reduced.

Fourth Embodiment

Figure 9:
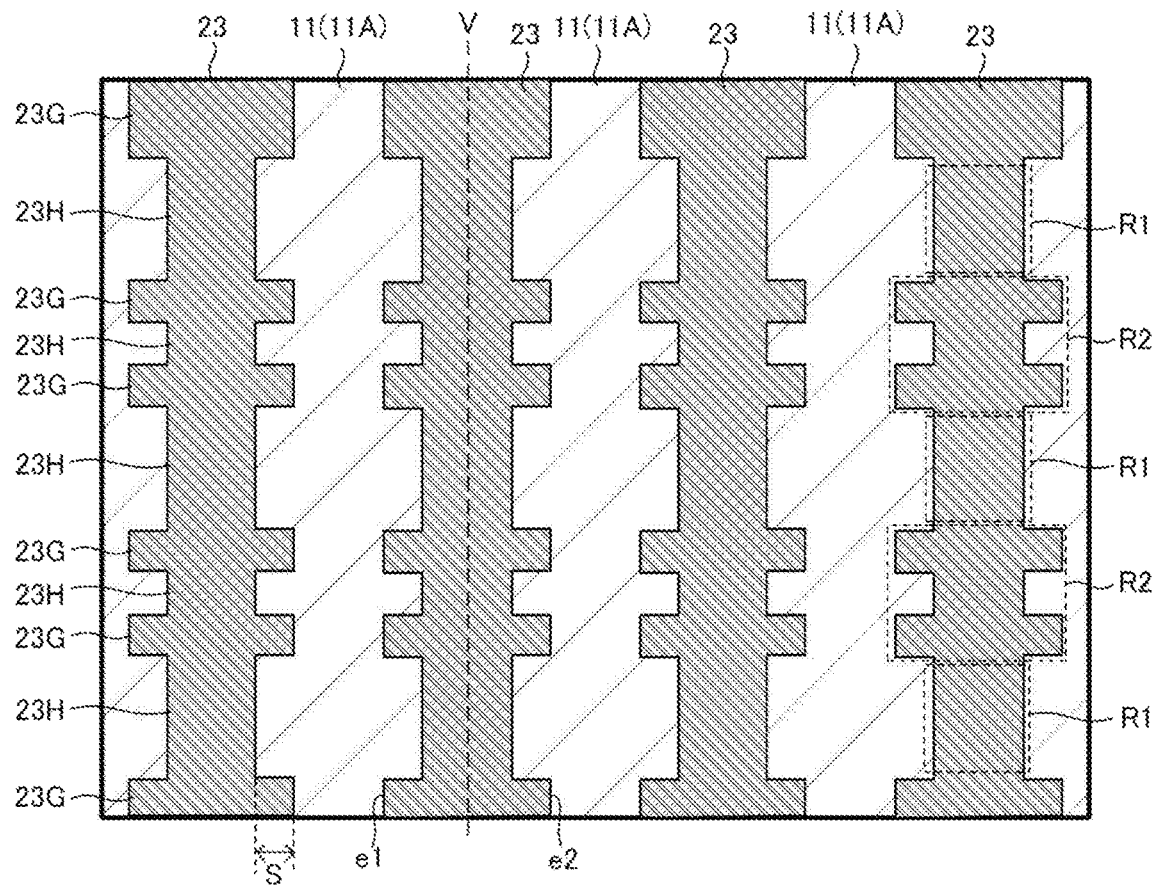
FIG. 9 is a view showing a pattern of the embedded parts in the X-Y cross-sectional view according to the fourth embodiment of the disclosure.

FIG. 9 is a view showing a pattern of the embedded parts in the X-Y cross-sectional view according to the fourth embodiment of the disclosure. As in the first embodiment, each of the embedded parts 23 has an elongated shape with the Y direction as the longitudinal direction, and the embedded parts 23 are arranged and spaced from each other in the X direction. In the present embodiment, two outer edges e1 and e2, opposite to each other across the imaginary line V parallel to the longitudinal direction (Y direction), of each embedded part 23 have an uneven shape respectively. That is, the width (length in the X direction) of each embedded part 23 differs according to the part along the longitudinal direction (Y direction) of the embedded part 23. Also, each embedded part 23 includes a first portion 23G having a relatively large width and a second portion 23H having a relatively small width, and the first portion 23G and the second portion 23H are arranged alternately along the longitudinal direction (Y direction). The step S between the first portion 23G and the second portion 23H is about 0.2 μm, for example.

In addition, each embedded part 23 includes a first region R1 having a constant width and a relatively large length in the longitudinal direction (Y direction), and a second region R2 in which a plurality of portions having different widths and a relatively small length in the longitudinal direction (Y direction) are continuous in the longitudinal direction (Y direction). The first regions R1 and the second regions R2 are arranged alternately along the longitudinal direction (Y direction).

The portion of the drift layer 11 extending between the adjacent embedded parts 23 (that is, the portion constituting the N-type column 11A) has the same configuration as the embedded part 23. The configuration, except for the pattern of the embedded parts 23, is the same as that of the semiconductor device 1 according to the first embodiment.

In terms of the pattern of the embedded parts 23 according to the fourth embodiment of the disclosure, as in the first embodiment, in the region where the width of the embedded part 23 is relatively small, the thickness of the wall surrounding the trench corresponding to the width of the N-type column 11A increases and the strength of the wall increases, so it is possible to reduce the risk of collapse of the wall surrounding the trench. Furthermore, by differentiating the width of each embedded part 23 according to the part along the longitudinal direction, the impurity amount of the embedded part 23 constituting the P-type column and the impurity amount of the drift layer 11 constituting the N-type column 11A are unbalanced. Thus, the fluctuation in charge balance due to manufacturing variation is suppressed, and as a result, the withstand voltage fluctuation can be suppressed. In particular, the pattern of the embedded parts 23 according to the present embodiment exhibits an excellent effect against the deterioration of charge balance due to dimensional variation of the embedded part 23 in the longitudinal direction. In addition, since the width of the embedded part 23 is constant in the depth direction (Z direction) of the semiconductor substrate 10, it is unnecessary to add photolithography and etching processes, and compared with the case where the width of the P-type column differs according to the depth, the manufacturing costs can be reduced.

Fifth Embodiment

Figure 10:
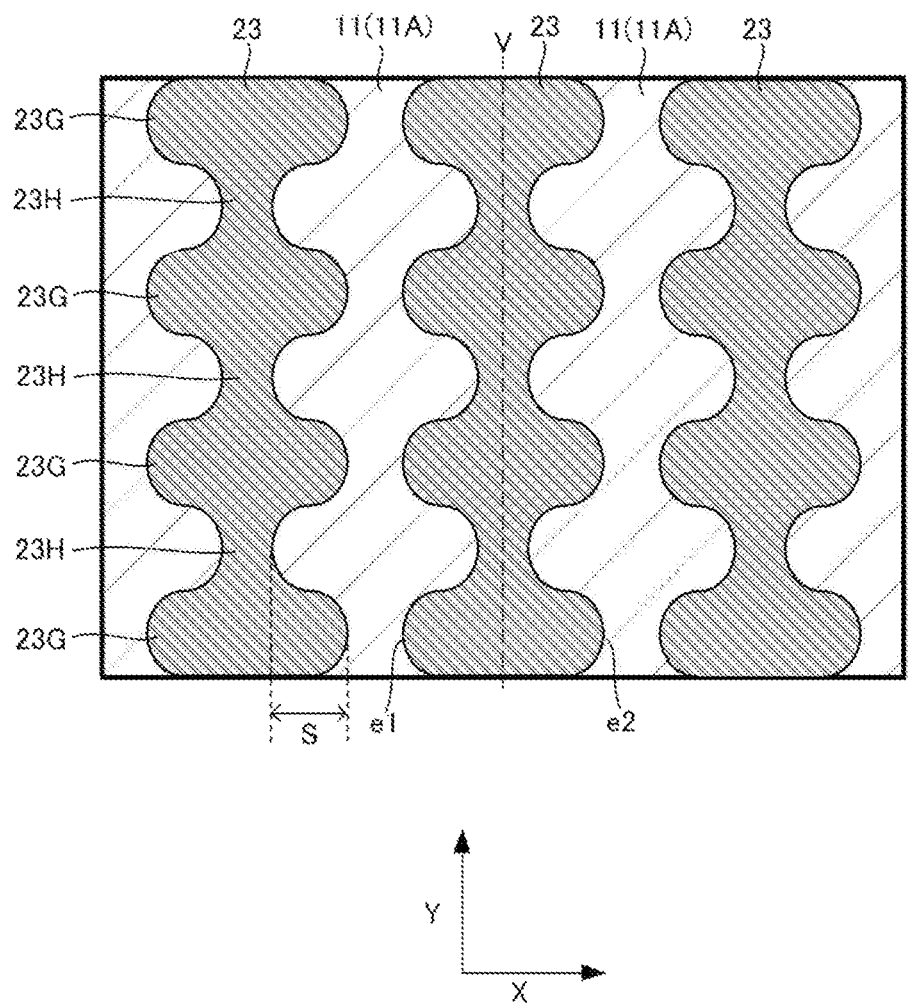
FIG. 10 is a view showing a pattern of the embedded parts in the X-Y cross-sectional view according to the fifth embodiment of the disclosure.

FIG. 10 is a view showing a pattern of the embedded parts 23 in the X-Y cross-sectional view according to the fifth embodiment of the disclosure. As in the first embodiment, each of the embedded parts 23 has an elongated shape with the Y direction as the longitudinal direction, and the embedded parts 23 are arranged and spaced from each other in the X direction. In the present embodiment, two outer edges e1 and e2, opposite to each other across the imaginary line V parallel to the longitudinal direction (Y direction), of each embedded part 23 have a curved and uneven shape respectively. That is, the width (dimension in the X direction) of each embedded part 23 differs according to the part along the longitudinal direction (Y direction) of the embedded part 23. Each embedded part 23 includes a first portion 23G having a relatively large width and a second portion 23H having a relatively small width, and the first portions 23G and the second portions 23H are arranged alternately along the longitudinal direction (Y direction). The step S between the first portion 23G and the second portion 23H is about 0.2 µm, for example.

The portion of the drift layer 11 extending between the adjacent embedded parts 23 (that is, the portion constituting the N-type column 11A) has the same configuration as the embedded part 23. The configuration, except for the pattern of the embedded parts 23, is the same as that of the semiconductor device 1 according to the first embodiment.

In terms of the pattern of the embedded parts 23 according to the fifth embodiment of the disclosure, as in the first embodiment, in the region where the width of the embedded part 23 is relatively small, the thickness of the wall surrounding the trench corresponding to the width of the N-type column 11A increases and the strength of the wall increases, so it is possible to reduce the risk of collapse of the wall surrounding the trench. Furthermore, by differentiating the width of each embedded part 23 according to the part along the longitudinal direction of the embedded part 23, the impurity amount of the embedded part 23 constituting the P-type column and the impurity amount of the drift layer 11 constituting the N-type column 11A are unbalanced. Thus, the fluctuation in charge balance due to manufacturing variation is suppressed, and as a result, the withstand voltage fluctuation can be suppressed.

In addition, since the width of the embedded part 23 is constant in the depth direction (Z direction) of the semiconductor substrate 10, it is unnecessary to add photolithography and etching processes, and compared with the case where the width of the P-type column differs according to the depth, the manufacturing costs can be reduced.

Sixth Embodiment

Figure 11:
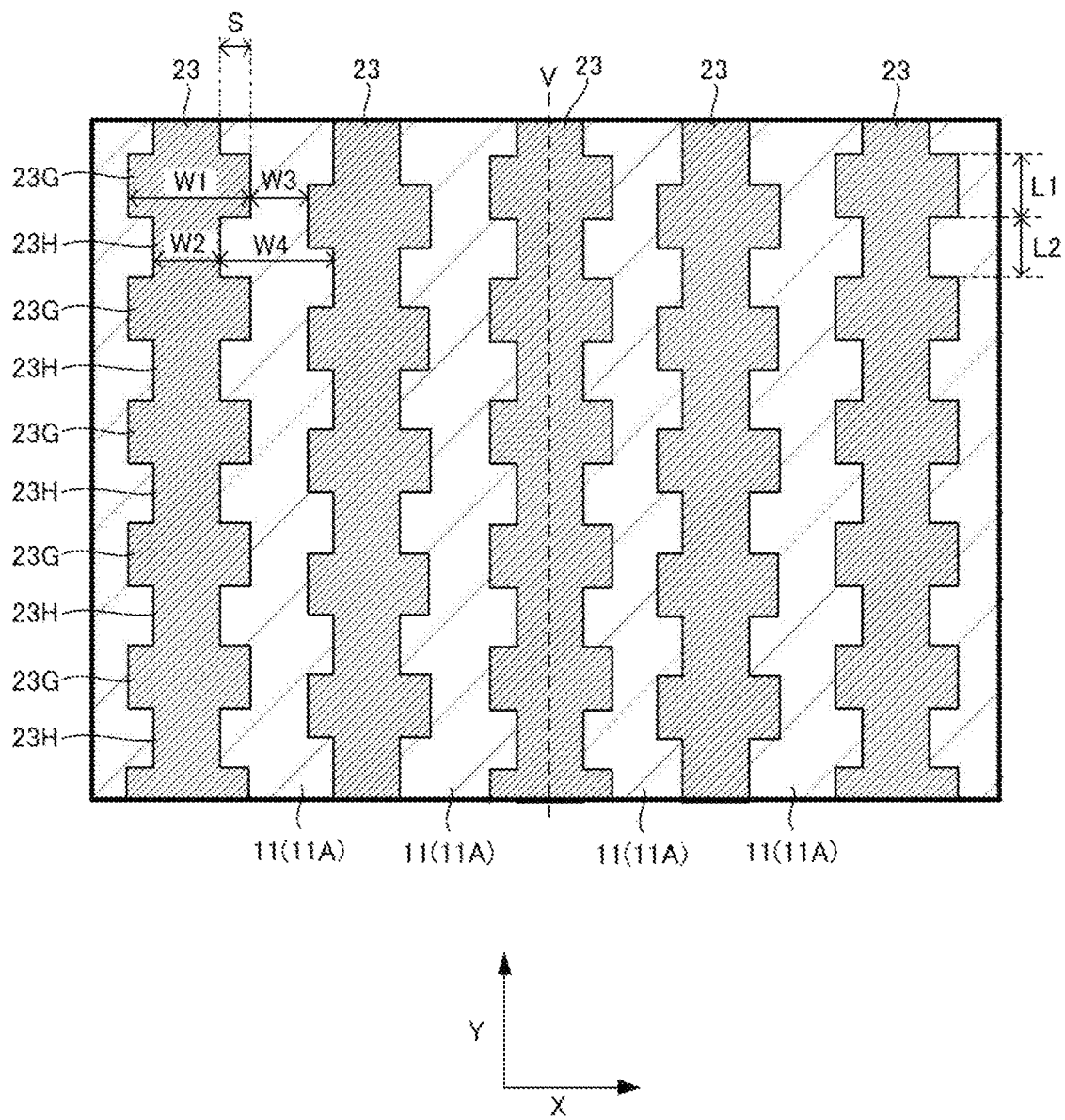
FIG. 11 is a view showing a pattern of the embedded parts in the X-Y cross-sectional view according to the sixth embodiment of the disclosure.

FIG. 11 is a view showing a pattern of the embedded parts 23 in the X-Y cross-sectional view according to the sixth embodiment of the disclosure. As in the first embodiment, each of the embedded parts 23 has an elongated shape with the Y direction as the longitudinal direction, and the embedded parts 23 are arranged and spaced from each other in the X direction. In the present embodiment, two outer edges e1 and e2, opposite to each other across the imaginary line V parallel to the longitudinal direction (Y direction), of each embedded part 23 have an uneven shape respectively. That is, the width (dimension in the X direction) of each embedded part 23 differs according to the part along the longitudinal direction (Y direction) of the embedded part 23. Each embedded part 23 includes a first portion 23G having a relatively large width and a second portion 23H having a relatively small width, and the first portions 23G and the second portions 23H are arranged alternately along the longitudinal direction (Y direction).

The arrangement of the first portions 23G and the second portions 23H is shifted in the longitudinal direction (Y direction) of the embedded part 23 between each embedded part 23 and the other embedded part 23 adjacent thereto, and the shift amount is a length corresponding to ¼ of the repetition period of the first portions 23G and the second portions 23H.

The length L1 of the first portion 23G in the longitudinal direction (Y direction) is the same as the length L2 of the second portion 23H in the longitudinal direction (Y direction). In addition, the width W1 of the first portion 23G of the embedded part 23 is the same as the width W4 of the drift layer 11 in the region where the second portion 23H of one of the adjacent embedded parts 23 and the second portion 23H of the other of the adjacent embedded parts 23 overlap in the X direction. The width W2 of the second portion 23H of the embedded part 23 is the same as the width W3 of the drift layer 11 in the region where the first portion 23G of one of the adjacent embedded parts 23 and the first portion 23G of the other of the adjacent embedded parts 23 overlap in the X direction. The step S between the first portion 23G and the second portion 23H is about 0.2 µm, for example.

In terms of the pattern of the embedded parts 23 according to the sixth embodiment of the disclosure, as in the first embodiment, in the region where the width of the embedded part 23 is relatively small, the thickness of the wall surrounding the trench corresponding to the width of the N-type column 11A increases and the strength of the wall increases, so it is possible to reduce the risk of collapse of the wall surrounding the trench. Furthermore, by differentiating the width of each embedded part 23 according to the part along the longitudinal direction of the embedded part 23, the impurity amount of the embedded part 23 constituting the P-type column and the impurity amount of the drift layer 11 constituting the N-type column 11A are unbalanced. Thus, the fluctuation in charge balance due to manufacturing variation is suppressed, and as a result, the withstand voltage fluctuation can be suppressed.

In particular, in the pattern of the embedded parts 23 according to the present embodiment, the arrangement of the first portions 23G and the second portions 23H is shifted in the longitudinal direction (Y direction) of the embedded part 23 between each embedded part 23 and the other embedded part 23 adjacent thereto. Thus, three regions are formed, which include the region where the first portion 23G of one of the adjacent embedded parts 23 and the first portion 23G of the other of the adjacent embedded parts 23 overlap in the X direction, the region where the first portion 23G of one of the adjacent embedded parts 23 and the second portion 23H of the other of the adjacent embedded parts 23 overlap in the X direction, and the region where the second portion 23H of one of the adjacent embedded parts 23 and the second portion 23H of the other of the adjacent embedded parts 23 overlap in the X direction. Therefore, even if the dimensions of the embedded part 23 deviate from the target due to the manufacturing variation, it is possible to maintain the charge balance in any of the three regions, which facilitates the effect of suppressing the withstand voltage fluctuation that accompanies the manufacturing variation.

In addition, since the width of the embedded part 23 is constant in the depth direction (Z direction), it is unnecessary to add photolithography and etching processes, and compared with the case where the width of the P-type column differs according to the depth, the manufacturing costs can be reduced.

Seventh Embodiment

Figure 12:
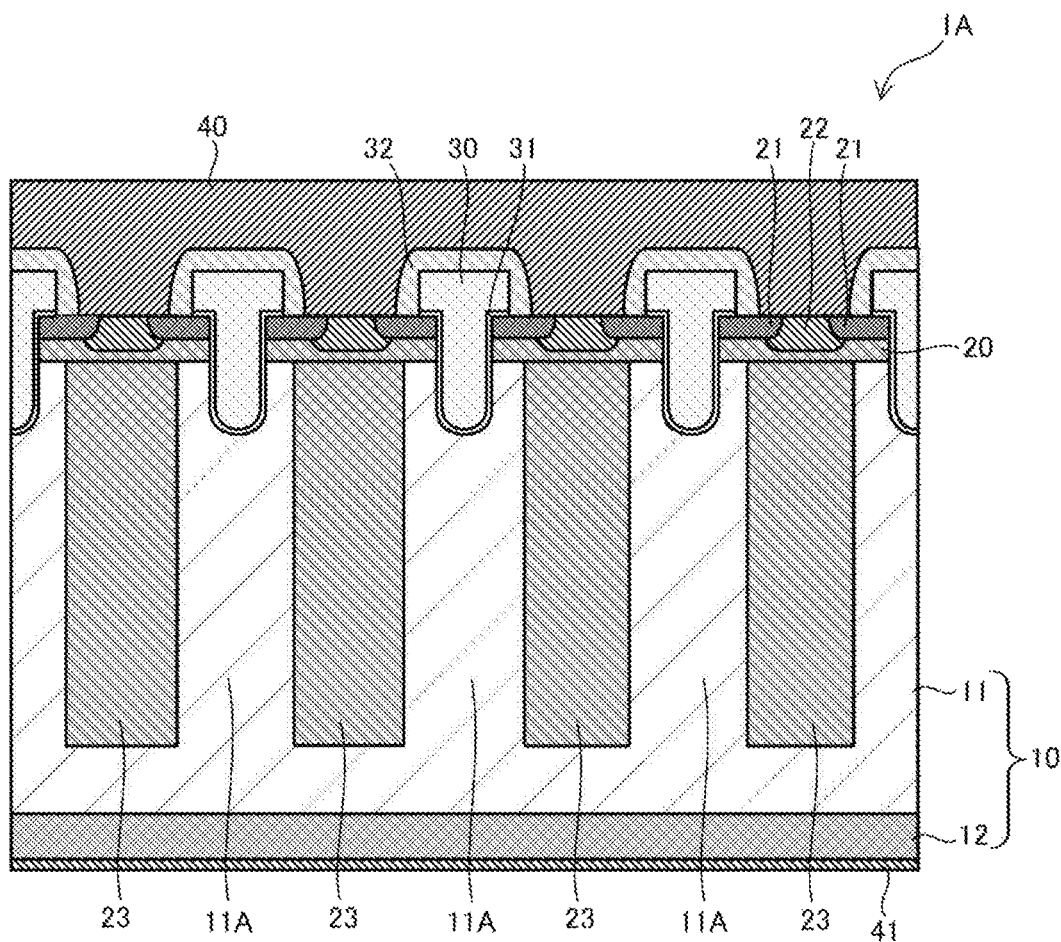
FIG. 12 is a cross-sectional view showing the configuration of the semiconductor device according to the seventh embodiment of the disclosure.

FIG. 12 is a cross-sectional view showing the configuration of a semiconductor device 1A according to the seventh embodiment of the disclosure. FIG. 12 shows an X-Z cross section of the cell part 2. The semiconductor device 1A is different from the semiconductor device 1 (see FIG. 2) according to the first embodiment in that the gate structure is a trench gate structure. That is, in the semiconductor device 1A, each gate electrode 30 extends from the front surface of the semiconductor substrate 10 through the body part 20 to the drift layer 11 (N-type column 11A). The semiconductor device 1A is the same as the semiconductor device 1 according to the first embodiment in that the structure of the drift layer 11 is a super junction structure.

Any of the patterns according to the first to sixth embodiments (see FIG. 3 and FIG. 7 to FIG. 11) can be applied as the pattern of the embedded parts 23 in the X-Y cross-sectional view in the semiconductor device 1A. By applying these patterns to the embedded parts 23, it is possible to achieve the same effect as in the case where the gate structure is a planar gate structure.

What is claimed is:

1. A semiconductor device, comprising:
    a drift layer of a first conductivity type;
    a plurality of embedded parts embedded in the drift layer and being of a second conductivity type different from the first conductivity type, wherein the embedded parts are arranged with a first direction as a longitudinal direction and spaced from each other along a second direction that intersects the first direction;
    a plurality of body parts of the second conductivity type disposed corresponding to each of the embedded parts in a surface layer portion of the drift layer and connected to the corresponding embedded part;
    a source of the first conductivity type disposed in a surface layer portion of each of the body parts;
    a gate electrode disposed on a front surface of the drift layer at a position across every two adjacent body parts; and
    a drain layer of the first conductivity type connected to a bottom portion of the drift layer,
    wherein a width of each of the embedded parts in the second direction changes continuously along the first direction,
    each of the plurality of embedded parts is embedded in a trench, and the width of the each of the embedded parts changes along an entirety of a length of the trench, and
    the plurality of embedded parts extending into the drift layer in a third direction are connected to bottom portions of the body parts respectively, and the third direction is orthogonal to the first direction and the second direction.

2. The semiconductor device according to claim 1, wherein two outer edges, opposite to each other across an imaginary line parallel to the first direction, of each of the embedded parts as viewed in a cross section parallel to each of the first direction and the second direction are respectively inclined with respect to the imaginary line.

3. The semiconductor device according to claim 2, wherein an inclination angle of one of the two outer edges with respect to the imaginary line in each of the embedded parts is different from an inclination angle of the other of the two outer edges with respect to the imaginary line.

4. The semiconductor device according to claim 3, wherein the inclination angle of at least one of the two outer edges of any one of the embedded parts with respect to the imaginary line is different from any inclination angle of each of the two outer edges of any other one of the embedded parts with respect to the imaginary line.

5. The semiconductor device according to claim 2, wherein an inclination angle of at least one of the two outer edges of any one of the embedded parts with respect to the imaginary line is different from any inclination angle of each of the two outer edges of any other one of the embedded parts with respect to the imaginary line.

* * * * *